United States Patent
Matsuhira et al.

[11] Patent Number: 6,111,629
[45] Date of Patent: Aug. 29, 2000

[54] DISPLAY DEVICE

[75] Inventors: Tsutomu Matsuhira; Mitsuru Suginoya; Takamitsu Aizawa, all of Chiba, Japan

[73] Assignee: Seiko Instruments Inc., Japan

[21] Appl. No.: 09/177,453

[22] Filed: Oct. 22, 1998

[30] Foreign Application Priority Data

Oct. 23, 1997 [JP] Japan ................................. 9-291342

[51] Int. Cl.$^7$ .................................................. G02F 1/1345
[52] U.S. Cl. ............................................. 349/150; 349/152
[58] Field of Search ................................. 349/149, 150, 349/151, 152; 345/205, 206; 361/767, 771, 779

[56] References Cited

U.S. PATENT DOCUMENTS

| | | | |
|---|---|---|---|
| 4,862,153 | 8/1989 | Nakatani et al. | 349/150 |
| 5,670,994 | 9/1997 | Kawaguchi et al. | 349/150 |
| 5,739,887 | 4/1998 | Ueda et al. | 349/151 |
| 5,838,412 | 11/1998 | Ueda et al. | 349/150 |

*Primary Examiner*—James A. Dudek
*Assistant Examiner*—Tai V. Duong
*Attorney, Agent, or Firm*—Adams & Wilks

[57] ABSTRACT

To make a display device compact and to provide an inexpensive, simple-structured display device. A structure where a terminal tip portion of a COF substrate is held folded down with a spacer sandwiched therebetween and is connected with a display element. A single COF is connected with a plurality of sides of the display element.

3 Claims, 5 Drawing Sheets

DISPLAY DEVICE

BACKGROUND OF THE INVENTION

The present invention relates to a display device for use in portable equipment, an electronic memo and the like which has a function such as pen input.

FIG. 5 shows a schematic structure of a conventional display device. As shown in FIG. 5, in a mounting structure of a conventional display device, a film substrate TCP (Tape Carrier Package) 8 provided with a slit for folding it down is used, and terminals of a display element 1 is connected with terminals of the TCP 8. An IC 4 is mounted on the TCP, and further, the TCP is connected with a circuit substrate such that fabrication is carried out with the TCP folded down and with the circuit substrate located on the rear surface of the display element. As the circuit substrate, a glass epoxy substrate, a polyimide film substrate or the like with chip parts mounted thereon has been used.

FIG. 6 shows a schematic view of a COF (Chip On FPC) structure with the IC 4 directly mounted on the film substrate 2. In a COF structure, the above-mentioned TCP circuit and the circuit of the circuit substrate are formed on a single film substrate.

However, in the structure shown in FIG. 5, since the TCP 8 is provided with a slit for folding down, and the folding down at the slit portion is carried out after the TCP 8 in a flat state is connected with the terminals of the display element 1 by thermocompression bonding, there is a problem that a margin 9 for folding down the TCP goes beyond the outer shape of the display device, resulting in larger size of the outer shape.

Further, depending on the direction of the folding down, the IC 4 and other electronic parts mounted on the film substrate are located between the film substrate and the display element. In that case, restriction with regard to the thickness of the whole film substrate increases in designing electronic equipment in which the display element is to be incorporated.

In the COF structure shown in FIG. 6, though the problem of parts location can be dealt with by a through hole, since the number of output electrodes of the IC 4 which is a driver IC is large, and the terminal connection pitch is fine, a through hole area 10 increase, which either decreases the parts mounting area or enlarges the outer shape of the film substrate, leading to increased design restriction.

Further, in case the connection between terminals of the film substrate and of the display element is structured as shown in FIG. 7, there arises design restriction with regard to a margin for folding down the film 2 and with regard to the through hole area.

Further, in case a COF formed of a single film substrate is connected with a display element where terminals are disposed on respective transparent substrates facing to each other, connection with one of the transparent substrates can be carried out, while connection with the other of the transparent substrates facing the one of the transparent substrates is very difficult in a compression bonding process. Therefore, in this case, the COF must be prepared for the terminals of the respective transparent substrates forming the display element.

Further, though an I/F cable may be connected with a circuit substrate as a discrete part, in case of a COF, the I/F cable is formed of FPC itself so as to be T-shaped or L-shaped. Because of the shape, the number of the COFs which can be taken from the material is small.

Accordingly, objects of the present invention are to make smaller the size of the outer shape of a margin portion for folding down a film substrate, to materialize a structure where a single film substrate can be easily connected with a plurality of sides of a display element, and to make larger the number of film substrates which can be taken from the material by improving the layout of I/F cables.

SUMMARY OF THE INVENTION

In order to solve these problems, a display device according to the present invention is structured such that the tip of terminals of a film substrate to be connected with a display element is held folded down with a spacer sandwiched therebetween, the film substrate in this state is disposed on the inner shape side of the display element, and the terminals of the film substrate are connected with the terminals of the display element.

Further, in case a display element having terminals on its plurality of sides is used, the terminals are disposed on the respective sides on one of the transparent substrates and the terminals of the film substrate are connected with the terminals on the respective sides.

Still further, an I/F cable is formed by making a U-shaped cut in the film substrate.

Since the film substrate in a folded state is disposed on the inner shape side of the display element and the terminals of the film substrate are connected with the terminals of the display element, the margin for folding down the film substrate does not go beyond the outer shape of the display element, or, the amount of the margin for folding down the film substrate going beyond the outer shape of the display element is decreased, and thus, the outer shape of the display device can be made smaller.

Further, restriction with regard to the parts mounting area and the wiring layout can be eliminated and the surface of parts such as an IC can be located on the front surface.

In case a display element having terminals on its plurality of sides, since the terminals are provided on a plurality of adjacent sides of one of transparent substrates forming the display element, a single film substrate can be connected with the terminals on the plurality of sides, and thus, the number of parts can be reduced.

Further, since the I/F cable is formed by making a U-shaped cut in the film substrate, the number of film substrates which can be taken from the material becomes larger.

DETAILED DESCRIPTION OF THE PREFERRED EMBODIMENTS

Embodiments of the present invention are described in the following based on the drawings.

Embodiment 1

Figure 1:
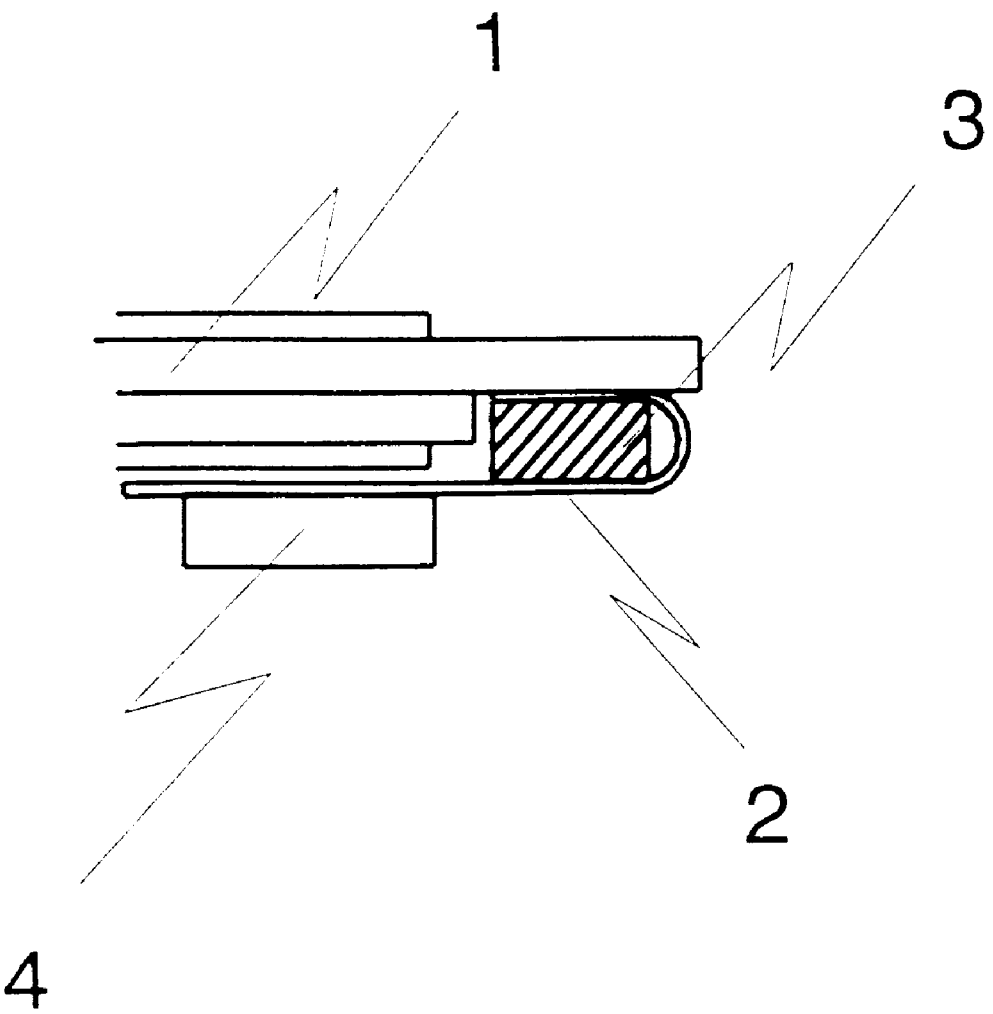
FIG. 1 is a side elevation showing a schematic structure of a display device according to the present invention.
Figure 2:
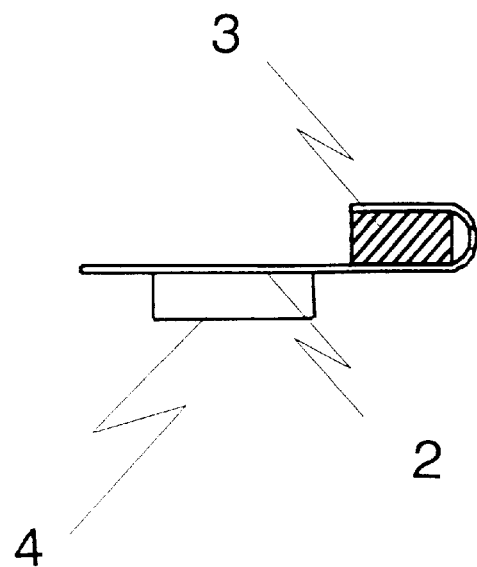
FIG. 2 is a side view showing a film substrate for use in the display device according to the present invention.

FIG. 1 is a side elevation showing a schematic structure of a display device according to the present invention. A display element 1 is structured by making glass substrates having a thickness of 0.5 mm and having transparent electrodes such as ITO formed thereon face to each other with patterned faces being on the inner side, encapsulating liquid crystal in the space between the glass substrates, and applying a polarizing plate. FIG. 2 is a side view showing a states of a film substrate just before being mounted on the display element. A driver IC 4 is face down mounted with an anisotropic conductive film on a film substrate 2 formed by patterning Cu on a polyimide film having a thickness of 25 microns. Output signal electrodes of the driver IC are led to terminals for connection with the display element, and are in a state of being folded down with a spacer 3 made of silicon and having a Shore A hardness of about 70 sandwiched with adhesive therebetween.

The terminals of the film substrate and of the display element are thermocompression bonded via the anisotropic conductive film to carry out connection. Though thermocompression bonding is typically carried out from the side of the film substrate, in this case, it is carried out from the side of the glass surface. Compression bonding for 20 seconds with the temperature of a compression bonding head being set at 250° C. reached temperature of about 180° C. to carry out sufficient curing in view of reliability.

The size of the outer shape of the display device according to the present invention shown in FIG. 1 could be made smaller than that of a conventional structure by about 1.5 mm. However, the present invention is not limited to a structure where a margin for folding down a film substrate is located inside the outer shape of terminals of a display device. There is no particular problem even if the margin for folding down the film substrate goes beyond the outer shape.

Treatment of the terminals of the film substrate is not limited to folding them down with a spacer sandwitched therebetween, and they may be wound or may have any other structure which functions similarly to that of the present embodiment. The material of the spacer is selected according to the temperature and the conditions at which the spacer is compression bonded against the liquid crystal display device and so on.

The size of the film substrate is not limited to the above-mentioned one. Further, a TCP may also be used.

Still further, the film substrate may be made of PET. In this case, since PET is permeable to ultraviolet light, the film substrate may be directly connected with the IC using ultraviolet-light-curing contractive adhesive. Similarly, the display element and the film substrate may be directly connected with each other using ultraviolet-light-curing contractive adhesive. Also, in this case, when the connection is carried out via conductor such as Ag, the reliability is further improved.

The connection between the terminals of the film substrate and of the liquid crystal display device may be carried out by pressure welding using a caulking metal frame without using the anisotropic conductive film or the ultraviolet-light-curing adhesive. In this case, replacement of the film substrate becomes easier.

Embodiment 2

Figure 3:
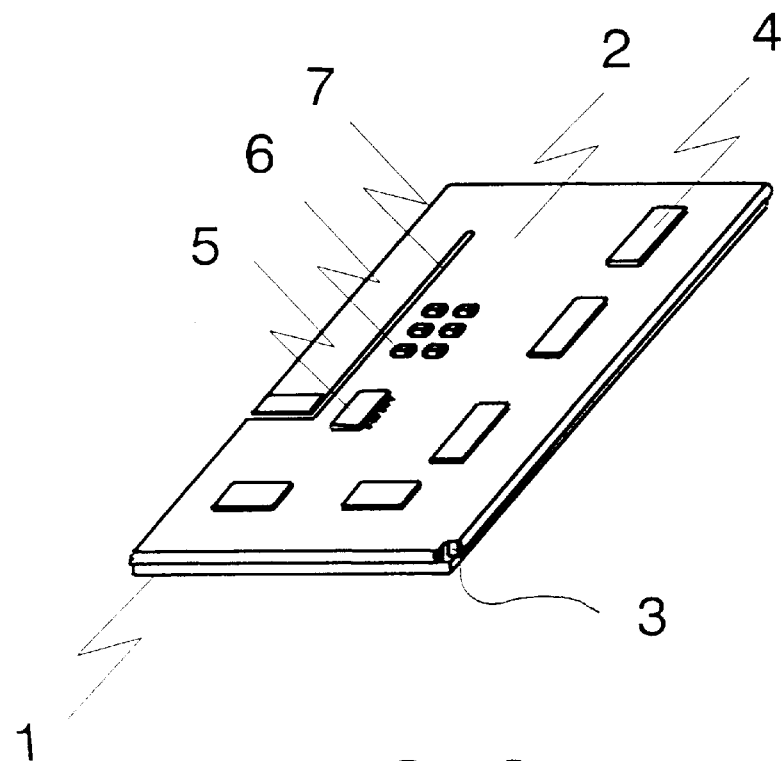
FIG. 3 is a perspective view showing a rear surface of a display device of Embodiment 2 according to the present invention.
Figure 4:
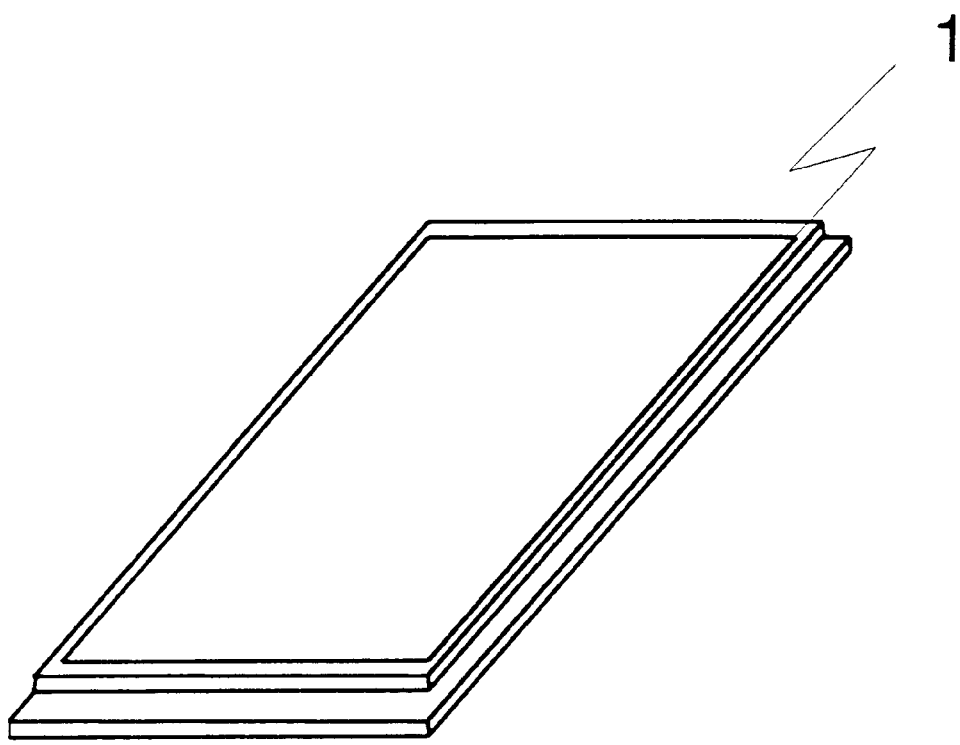
FIG. 4 is a perspective view showing a rear surface of a liquid crystal display element of Embodiment 2 according to the present invention.
Figure 5:
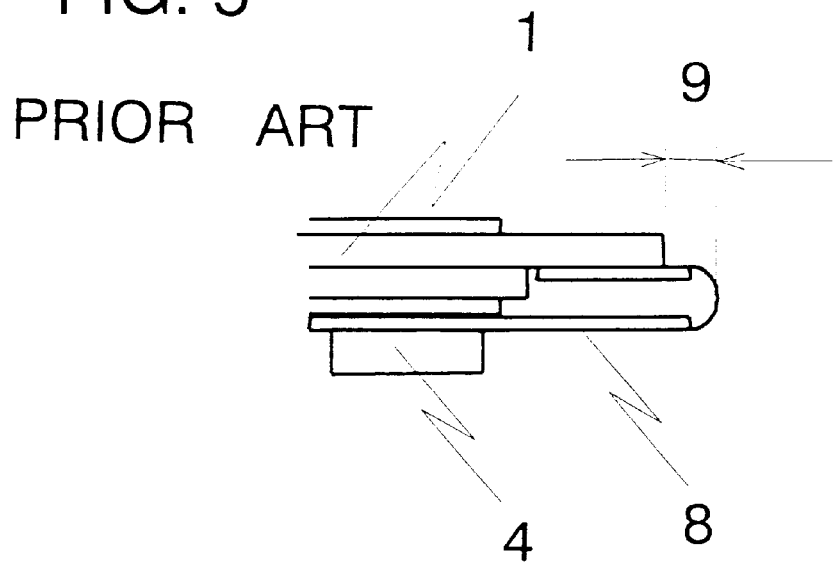
FIG. 5 is a side view showing a schematic structure of a conventional display device.
Figure 6:
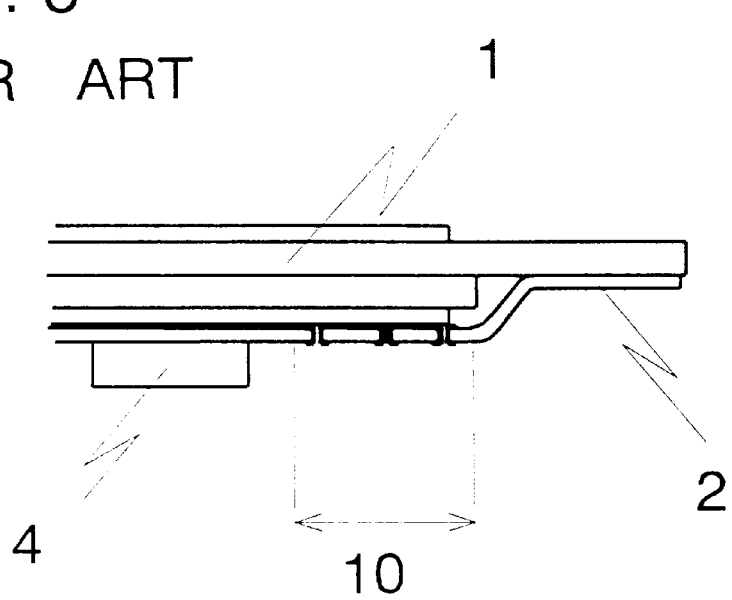
FIG. 6 is a side view showing a schematic structure of a conventional COF type display device.
Figure 7:
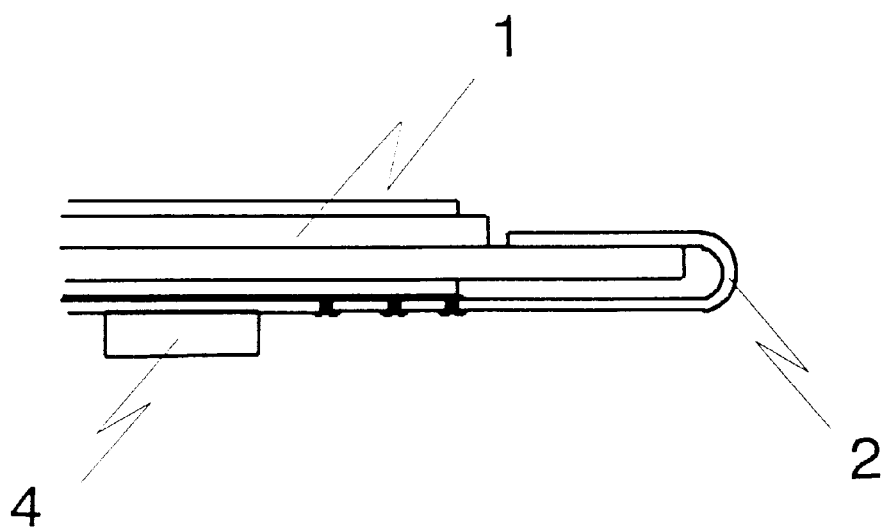
FIG. 7 is a side view showing a schematic structure of a conventional COF type display device with a folded-down portion.

FIG. 3 is a perspective view of Embodiment 2 of the display device according to the present invention. FIG. 4 is a display element 1 used in Embodiment 2 and is a perspective view seen from the rear side. Here, description is made in case an STN type liquid crystal display element is used as the display element by way of example. Electrodes of an upper transparent substrate in FIG. 4 are connected with a terminal pattern provided on the side of a lower transparent substrate in FIG. 4 using a conductive agent disposed in a liquid crystal panel. Therefore, all terminals to be connected with the external are provided on the lower transparent substrate.

A film substrate 2 is a double-sided wiring board and is a substrate formed by patterning Cu on both sides of polyimide as a base having a thickness of 25 microns, and is provided with a through hole. In addition to a driver IC 4, an IC package 5 and chip parts 6 are connected with the film substrate 2 by soldering or the like.

The film substrate 2 and the display element 1 are connected in a similar way as in Embodiment 1, and the connection is carried out with regard to the respective sides one by one in order.

Further, an I/F cable is formed by a part of the film substrate by making an L-shaped cut 7, and thus, the number of the film substrates which can be taken from the material can be made larger.

In case a PET substrate is used, in order to mount thereon the IC package and the chip parts, by using Ag paste or Bi/Sn series soldering as the material, connection at 150° C. or lower can be carried out to avoid deformation.

As described in the above, according to the present invention, a miniaturized, compact display device can be provided. Further, in case a film substrate is mounted on a plurality of sides of a liquid crystal display element, by reducing the number of parts, in addition to the above-mentioned effect, an inexpensive display device can be provided.

What is claimed is:

1. A display device wherein terminals of a display element formed of transparent substrates and liquid crystal held therebetween are connected with a terminal portion of a film substrate, characterized in that said film substrate is located on the inner shape side of said display element, and that said terminal portion of said film substrate is folded back with a spacer sandwiched therebetween and is connected with said terminals of said display element.

2. A display device as claimed in claim 1, characterized in that said terminals of said display element are disposed on a plurality of adjacent sides of one of said transparent substrates and that said terminal portion of said film substrate is connected with said plurality of sides.

3. A display device as claimed in claim 1, characterized in that an I/F terminal is formed by making a cut in said film substrate.

* * * * *